United States Patent [19]

Watanabe

[11] Patent Number: 4,601,539
[45] Date of Patent: Jul. 22, 1986

[54] LENS MOVING DEVICE USING PIEZOELECTRIC MATERIAL

[75] Inventor: Yoshiaki Watanabe, Kanagawa, Japan

[73] Assignee: Canon Kabushiki Kaisha, Tokyo, Japan

[21] Appl. No.: 606,720

[22] Filed: May 3, 1984

[30] Foreign Application Priority Data

May 7, 1983 [JP] Japan ................................. 58-79495
Feb. 13, 1984 [JP] Japan ....................................... 24614
Apr. 12, 1984 [JP] Japan ................................. 59-74793

[51] Int. Cl.$^4$ .......................... G02B 7/04; H01L 41/04
[52] U.S. Cl. ...................................... 350/255; 310/369
[58] Field of Search .......................... 350/255; 369/45; 310/369

[56] References Cited

U.S. PATENT DOCUMENTS

| 3,088,370 | 5/1963 | Erbe et al. | 350/255 |
| 3,562,563 | 2/1971 | Schafft | 310/369 |
| 3,915,560 | 10/1975 | Levine et al. | 350/255 |
| 4,291,958 | 9/1981 | Frank et al. | 354/402 |
| 4,303,324 | 12/1981 | Marcus | 350/255 |
| 4,342,935 | 8/1982 | Kallmeyer et al. | 310/369 |

Primary Examiner—William H. Punter
Attorney, Agent, or Firm—Toren, McGeady, Stanger, Goldberg & Kiel

[57] ABSTRACT

An axially movable lens holder sleeve has a drive member or members made of piezoelectric material on one or either side thereof with a bias spring member on the opposite side or in sandwiched relation. When a voltage proportional to the required amount of movement of the lens is applied to the drive member, adjustment in position of the lens is controlled.

6 Claims, 14 Drawing Figures

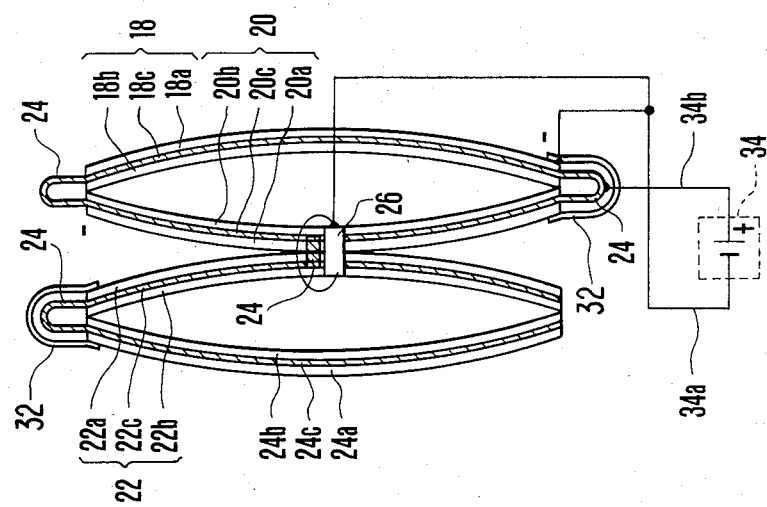
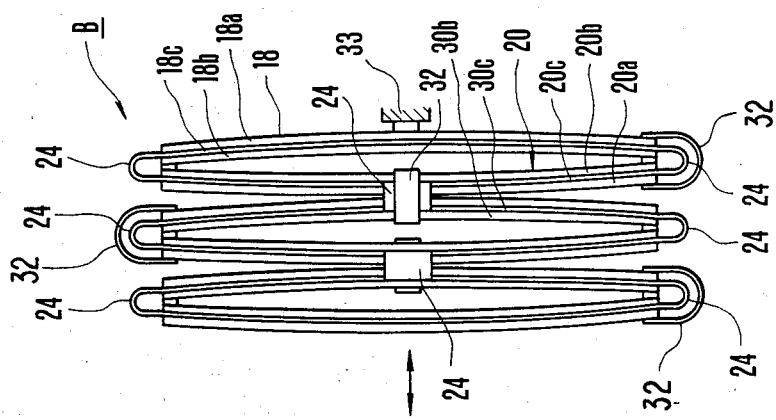

LENS MOVING DEVICE USING PIEZOELECTRIC MATERIAL

BACKGROUND OF THE INVENTION

1. Field of the Invention

This invention relates to the technique of automatically controlling the movement of a lens by electrical signals for application to the field of photographic instruments such as cameras having drive devices for movable lenses and to the field of business machines such as copiers having drive devices for movable lenses, and more particularly to lens drive devices using piezoelectric material.

2. Description of the Prior Art

The technique of automatically controlling adjustment of a movable lens to a desired position, for example, to an in-focus position, has found use in many automatic focus adjusting devices.

As a typical example of an automatic focus adjusting apparatus mention may be made of the lens moving apparatus disclosed in Japanese Laid-Open Patent Application No. Sho 54-80741. In this lens moving apparatus, the movable lens is contained in the holder sleeve urged by a spring member toward the position for an object at infinity or at the minimum distance, and, as it moves from the opposite position thereto, it is arrested by a focusing control signal from the in-focus detector.

The operating mechanism for the movable lens in the above-described automatic focus adjusting apparatus and in many other prior art devices necessitates utilization of a great number of constituent parts, such as the drive spring member and the arresting member in the form of a plunger, and involves a complicated assembling process. On the assembly line, it is also necessary to introduce the step of adjusting each unit. This impedes to a much desired reduction in the production cost of the article.

Further prior art devices involving lens moving apparatus are disclosed in Japanese Laid-Open Patent Applications Nos. Sho 57-92321 and Sho 57-92322 and U.S. Pat. No. 4,291,958.

The above-cited three prior art examples concern lens moving apparatus using a piezoelectric element called "piezoelectrically operated lens motor" and sold under the tradename of "Bimorph" from Vernitron Co. Ltd. This lens motor according to the above-described Japanese Laid-Open Patent Applications is constructed in the form of a 30 mm long, 0.5 mm thick and 5.0 mm wide plate (rod) of piezoelectrically operated bender element with its one end fixedly supported and its opposite end fixedly carrying a lens holder frame. When a voltage is applied, the bender element is distorted to effect axial movement of the lens holder.

SUMMARY OF THE INVENTION

It is an object of the present invention to provide a lens moving apparatus capable, with the use of a piezoelectric material, of controlling the movement of a lens reliably and accurately.

Another object of the invention is to provide a lens drive member of piezoelectric material shaped so that it can be formed as a single unit.

Still another object of the invention is to provide a method of constructing the lens drive member so as to increase the total movement of the lens and a moving apparatus employing the same.

BRIEF DESCRIPTION OF THE DRAWINGS

FIGS. 1 to 4 illustrate a first embodiment of the present invention. Of these drawings, FIG. 1 is a longitudinal section view of the main parts of a lens moving apparatus. FIG. 3 is a graph illustrating variation of the amount of distortion versus voltage of the lens drive member made of piezoelectric material. FIG. 4 is a longitudinal section view of an example of modification of the apparatus.

FIGS. 5, 6(a) and 6(b) illustrate a second embodiment of the invention. Of these drawings, FIG. 5 is a longitudinal section view of the main parts of a lens moving apparatus. FIG. 6(a) is a sectional view illustrating the details of construction of a lens drive member. FIG. 6(b) is a schematic diagram illustrating an electrical connection between a voltage source and the drive member.

FIGS. 7(a) to 10 illustrate a third embodiment of the present invention. Of these drawings, FIG. 7(a) is a plane view of lens drive members. FIG. 8 is a longitudinal section view of the main parts of a lens moving apparatus. FIG. 9 illustrates a manner in which the drive members operate. FIG. 10 is a longitudinal section view illustrating an example of modification of the apparatus.

DESCRIPTION OF THE PREFERRED EMBODIMENTS

Figure 1:
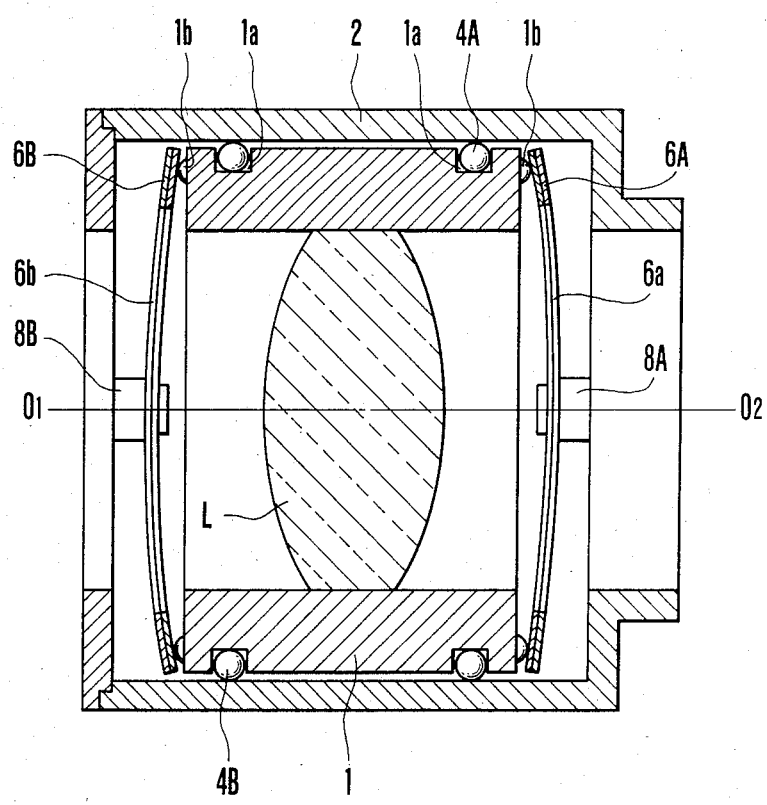

In FIGS. 1 to 4 there is shown the first embodiment of the invention. A lens L is held in a sleeve 1 which is fitted in the inner diameter of a body tube 2 constituting a lens barrel to be movable along an optical axis O1-O2. The lens holder sleeve 1 has a pair of circumferential grooves 1a in the outer surface thereof, in which lie ball bearings 4A and 4B to reduce the friction against the body tube 2. Two drive members 6A, 6B of annular shape are made of piezoelectric material and are initially bent under strain so as to depict a large arc in the cross-section. They include central apertured portions 6a and 6b each of which form a passage for light. The lens holder sleeve 1 has a pair of friction reducing semi-spherical lobes 1b on the shoulder of either side thereof against which abut the respective end portions of the lens drive member 6A, 6B at the flat surface portion thereof. The drive members 6A and 6B are fixedly mounted at portions of their ring-like bodies to the body tube 2 through fastening means 8A and 8B respectively.

Figures 2A, 2B, 2C:
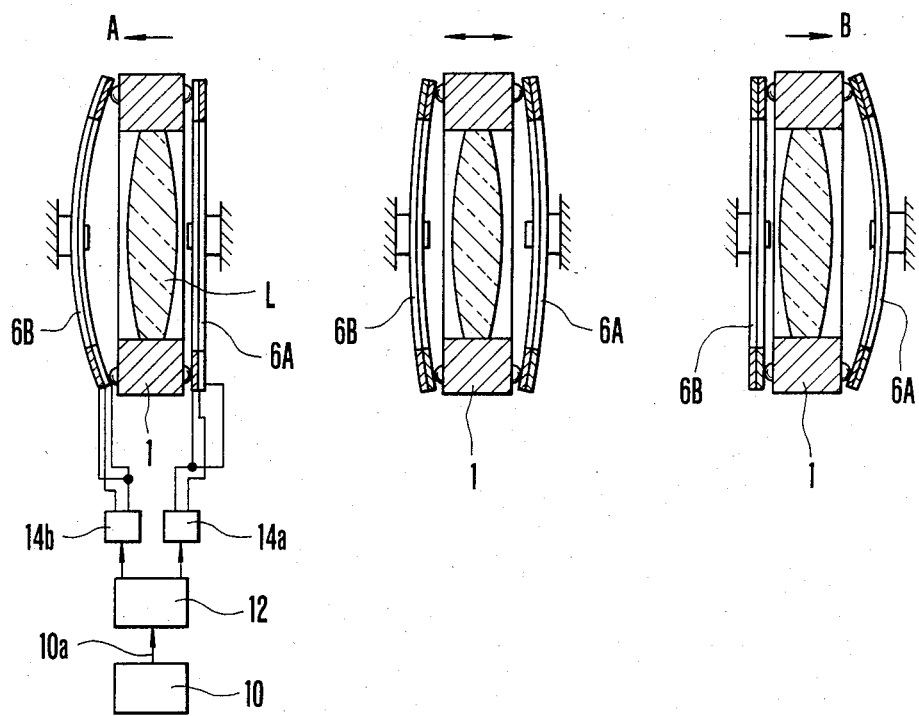
FIGS. 2(a), 2(b) and 2(c) are section views which illustrate a manner in which the lens drive members operate.

FIGS. 2(a), 2(b) and 2(c) illustrate the first lens moving apparatus in different operative positions as the voltage applied to the aforesaid drive members changes. Range finding means 10 produces an output signal 10a representing the distance measured which is then applied to voltage generating means 12. The range finding means 10 may be constructed based on the principles of the prior known automatic focus detector. The signal 10a functions to indicate detection of when an image of an object to be photographed is out of focus on the film plane along with which side of the film plane includes the sharp image—if it is the front side, the so-called "near focus state" and if on the rear side, the so-called "far focus state" together with the magnitude by which the lens L must be moved to bring a sharp image onto the film plane and of when the lens L is in focus. Responsive to this signal 10a, the voltage generating means 12 selectively renders operative first and second gating means 14a and 14b for allowing the voltage to be applied to the first and second lens drive members 6A and 6B respectively.

In the position of FIG. 2(a), the signal 10a from the range finging means 10 allows the voltage to be applied to the first lens drive member 6A so that the lens holder 1 is moved to the right under the piezoelectric action. If the signal 10a has the opposite sign, the voltage is applied through the second gating means 14b to the second drive member 6B by which the lens holder 1 is moved to the left to the position of FIG. 2(c). A stationary state of the lens holder 1 is indicated at FIG. 2(b).

Figure 3:
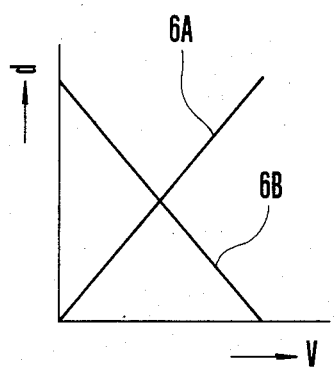

FIG. 3 illustrates the distorted amount "d" (mm) of the lens drive members 6A and 6B as a function of the applied "V" (volt).

Figure 4:
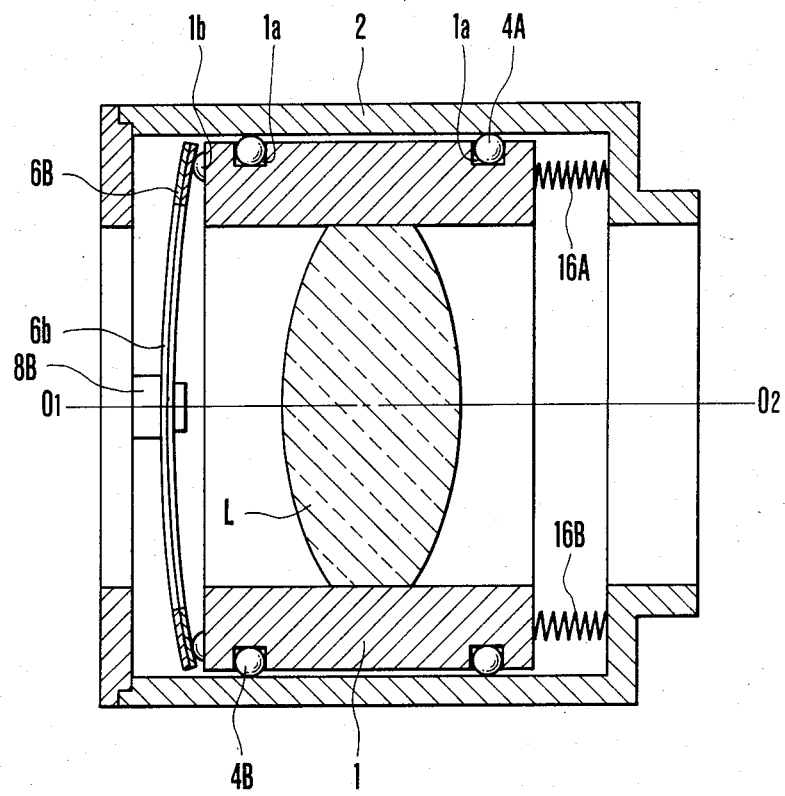

As illustrated in FIG. 4, the lens moving apparatus of FIG. 1 may be modified by using a pair of spring members 16A and 16B instead of the first piezoelectric drive member 6A. The spring members 16A and 16B are given a bias force urging the lens L to be held in the initial axial position.

The range finding means produces an output signal representing the distance by which the lens L must be moved to bring the image into focus. Also produced is the corresponding voltage from the voltage generating means 12. This voltage is applied through a signal line (not shown) to the only drive member 6B by which the lens holder sleeve 1 is driven to move along the optical axis O1–O2 against the bias force of the spring members 16A and 16B.

It will be appreciated that the example of the lens moving apparatus of FIGS. 1 to 4 comprises lens drive means in the form of an annular cross member 6A, 6B of piezoelectric material with its outer peripheral margin abutting on the lens holder sleeve 1 so that the lens L is driven to move under the piezoelectric action when a voltage is applied thereto. According to the present invention, the lens drive member can be formed to an axial thickness so thin that it can be positioned in a very narrow space between the shell of the body tube and the terminal end of movement of the lens holder. Also there is no reason for requiring a complicated arrangement of electrical wiring between the drive member and a control circuit therefor. Thus it is possible to construct the lens moving apparatus in a very compact form.

Figure 5:
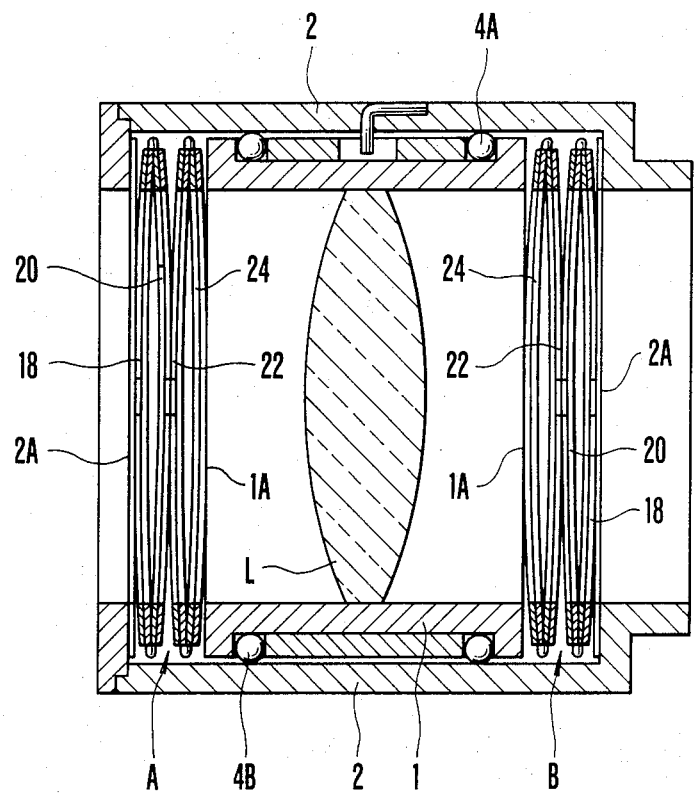

FIGS. 5, 6(a) and 6(b) illustrate a second embodiment of the present invention. In this embodiment the drive member of the lens moving apparatus comprises two drive elements 18 and 20, each similar in size and shape to the drive members of FIG. 1, which are assembled with each other in confronting relation at their concave surfaces and cemented with each other at their adjoining edges to form one unit. A plurality of these units (in the instance of FIG. 5, two units, 18, 20; 22, 24) are placed side by side to form a first drive member A arranged between the left hand end surface 1A of the lens holder sleeve 1 and a flange 2A of the lens barrel 2.

This embodiment has the aim of increasing the total movement of the lens L for an equivalent voltage applied by using a plurality of annular drive members of piezoelectric material.

FIGS. 6(a) and 6(b) illustrate how to electrically connect all the drive elements in each assembly to each other and to a voltage source.

The element 18 is constructed with two curved annular layers 18a and 18b made of piezoelectric material available under the tradename of "Bimorph" described above or of zirconium titanate (PZT) with an electrode 18c laminated therebetween. The second element 20 is also constructed in similar way to the element 18. It is preferable to use, as the material of the electrode 18, a platinum foil or a copper foil.

The first and second elements 18 and 20 are bent in opposite directions to each other, and are in contact with each other at the outer periphery. The electrode layers 18c and 20c are electrically connected with each other by electrically conductive wires 24 and the annular layers 18a and 20a are fixedly secured to each other by a connector 26. 32 is an electrically conductive connector for the annular layers 20b and 30b. 33 is a fastener member for fixedly mounting the lens drive member B on the stationary portion of the barrel. The annular element 18 is fixed at a portion thereof by a screw fastener or the like.

In FIG. 6(b) there is shown a path of current from a positive terminal of voltage applying means 34 through the drive element to a negative terminal thereof. The minus terminal 34a is connected to the first annular layer 18a. This minus terminal voltage goes through the connector member 26 to one pair of the outer layers 18a and 20a of the drive elements 18 and 20, and therefrom to the inner layer 20b of the element 20. Since the layer 18b is connected to the layer 20b, the electrodes 22c and 20c are connected to each other by the electrode connector member 24, and by the connection relationship of 22c-24-20c-24-34b-18c a plus voltage is applied to the layer 18b.

The minus terminal is connected in sequences 24a-26-22a-20a-26-34a and 24b-22b-26°b-18b-34b.

In the embodiment of FIG. 5, each of the lens drive members A and B is constructed with four annular electrodistortion elements in superimposed relation, and is arranged so that the outer peripheral surfaces of the annular portions abut against the end surface 1A of the lens holder sleeve 1 and the stationary portion 2A of the barrel 2.

When a voltage is applied to either one of the lens drive members by range finding means and voltage applying means (not shown), the lens holder L is driven to move four times the distance of the first embodiment of FIG. 1. When in case of FIGS. 6(a) and 6(b), the total movement increases six times as large.

As has been described above, in case of this embodiment, if the number of annular drive elements superimposed successively is in such relation that their directions of distortion alternate relative to each other and electrically connected in series between the successive adjacent two, is n, a unit of laminated lens drive elements that has n times the amount of distortion of single element and operates with a voltage equal in value to that for only one element can be obtained.

A voltage applying system usable in the embodiment of FIG. 5 may take the form illustrated in FIG. 2(a).

FIGS. 7(a) to 10 illustrate a third embodiment of the invention.

This embodiment illustrates an example providing a lens moving apparatus using piezoelectric material characterized in that a plurality of support members having an abutment portion on a lens holder sleeve containing a lens and each formed to a helical shape extending from said abutment portion are made of piezoelectric material in unison, and as one end of each of the aforesaid support members abuts against the flange of the barrel or is fixedly secured thereto, when a voltage of magnitude proportional to the required amount of movement of the aforesaid lens is applied to the aforesaid support members, the aforesaid lens is driven to move by the piezoelectric action.

In the following, this embodiment will be described in greater detail with reference to the drawings.

Figure 7B:
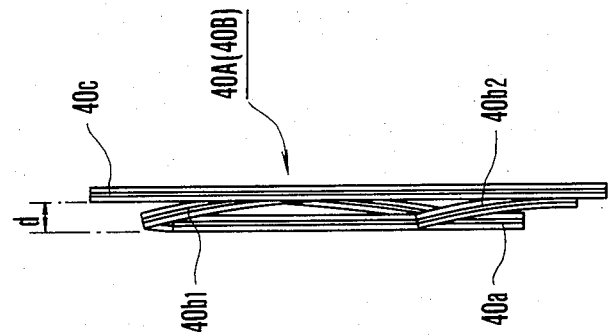
FIG. 7(b) is a side elevational view of the lens drive members.
Figure 7A:
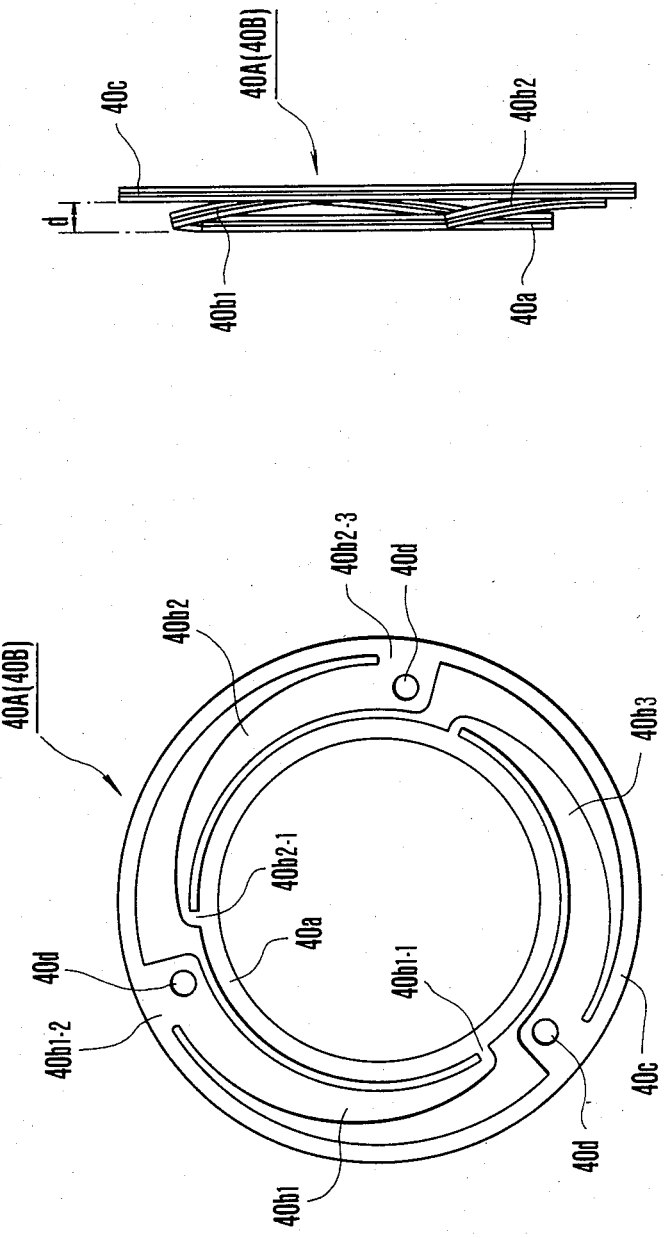

FIGS. 7(a) and 7(b) illustrate a lens drive member 40A, 40B in this embodiment. The lens drive member 40A (40B) consists of a ring-shaped abutment portion 40a at the innermost side thereof and a plurality of support arms 40b1, 40b2 and 40b3 helically or spirally extending from the outer periphery of the abutment ring 40a, and an outer ring portion 40c contiguous to the opposite ends of the aforesaid support arms, and all of these portions are formed as a unit by using a piezoelectric material. The width of each support arm 40b1, 40b2, 40b3 becomes progressively narrower as the length goes from the node 40b1-2 adjacent the outer ring to the neck 40b1-1 adjacent the inner ring 40a so that the arms 40b1, 40b2 and 40b3 become easier to undergo resilient action as they near the necks 40b1-1. A hole 40d in each node is provided for fixedly securing the said lens drive member to the flange of the lens barrel by a suitable fastener. As the piezoelectric material, zirconium titanate (PZT) or like material of proper polarity between two pieces is better to use.

Figure 8:
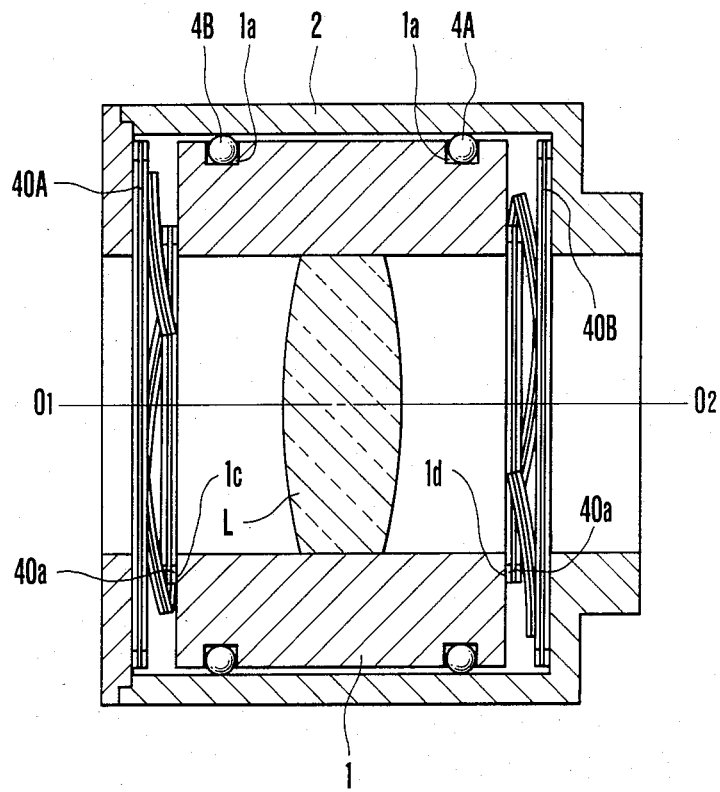

FIG. 8 in sectional view illustrates the main parts of a lens moving apparatus using the drive member shown in FIGS. 7(a) and 7(b), wherein the same reference characters have been employed to denote the similar parts to those shown in FIG. 1. Two of the drive members 40A and 40B are used as arranged in confronting relation to each other on either side of the lens holder sleeve 1 with the inner ring or abutment portion 40a in contact with the end surface 1c, 1d of the lens holder 1, and with the holes 40d fixedly secured to or in contact with the flange of the barrel 2.

Figure 9:
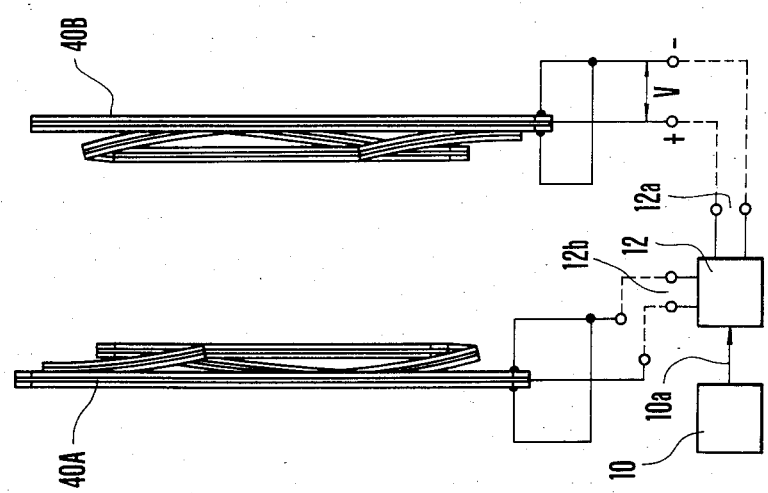

FIG. 9 illustrates a control circuit for the lens moving apparatus of FIG. 8. At first, a distance from the apparatus to a target object (not shown) is measured by a range finder 10 and a signal 10a representing that distance is produced. This signal 10a is applied to a voltage generating means 12. The signal 10a has factors of positive and negative signs indicative of the near focus, in focus and far focus depending upon the relative position of the target object and the movable lens L and of the distance by which the lens L must be moved to bring the image into focus. The positive and negative signs of the signal selectively render operative the first and second drive members 40A and 40B respectively depending upon the near focus and the far focus of the movable lens. The voltage generating means 12 responsive to the aforesaid signal 10a determines which of the lens drive members 40A and 40B has to be actuated and produces an output voltage of magnitude proportional to the distance by which the lens must be moved to bring the image into focus at either one of output terminals 12a and 12b. The one of the lens drive members 40A and 40B which is supplied with that voltage takes piezoelectric action, driving the lens holder sleeve 1 to move axially.

According to this embodiment, the lens drive members 40A and 40B are constructed with helical support arms 40b1, 40b2 and 40b3 of resilient property in unison with the abutment 40a, thereby giving an advantage that the production cost can be limited to a minimum. Further the impartment of the resilient property into the support arm facilitates a valuable increase in the range of movement of the lens holder sleeve 1.

Further in the lens moving apparatus of FIG. 8, the lens holder sleeve 1 can be operated with the reduced frictional load by means of ball bearings 4A and 4B or shaft bearing means, and the movement of the lens can be controlled in accordance with the applied voltage as a function of the signal without involving any loss in the voltage. Therefore, the apparatus of the invention is applicable to any automatic focus adjusting system which requires high accuracy and high reliability of distance measurement.

Figure 10:
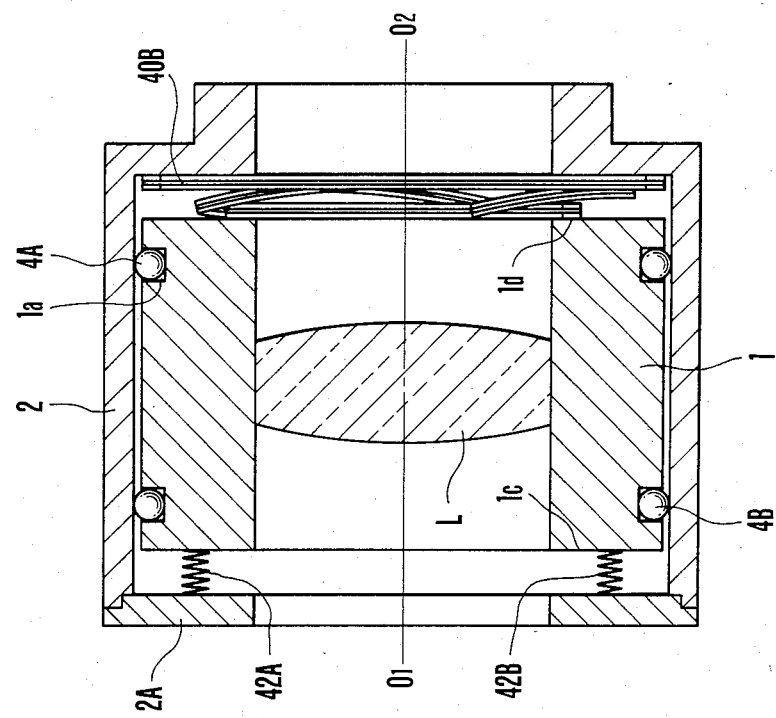

As an example of modification of this embodiment, one of the aforesaid lens drive members 40A and 40B may be replaced by a spring member. That is, as illustrated in FIG. 10, two springs 42A and 42B are arranged between the flange 2A of the barrel and the lens holder sleeve 1, and the bias force of the springs 42A and 42B is adjusted so that when the voltage applied to the remaining lens drive member 40B is zero volt, as the springs 42A and 42B are in balance with the resilient force of the support arms 40b1, 40b2 and 40b3 of the drive member 40B, the movable lens 2 assumes an initial position. Then, the range finder (not shown) is operated and produces an output signal representing the object distance. Responsive to this signal, the voltage generator produces a voltage which is then applied to the lens drive member 40, whereby the lens drive member is caused to operate under the piezoelectric action by which the lens holder sleeve 1 is driven to move against the bias force of the springs 42A and 42B. In the example of the embodiment of FIG. 10, because the piezoelectric force of the lens drive member 40B has to overcome the bias force of the spring drive members 42A and 42B, a larger voltage than when in the first embodiment is necessary. But the construction of the lens moving apparatus and the complexity of the circuit can be simplified substantially.

While specific embodiments of the invention have been shown and described in detail to illustrate the application of the inventive principles, it will be understood that the invention may be embodied otherwise without departing from such principles.

What I claim:

1. A lens moving apparatus comprising:
   (a) a lens holder sleeve containing a movable lens;
   (b) a body tube containing said lens holder sleeve;
   (c) a member urging said lens holder sleeve to an initial position; and
   (d) a lens drive member arranged on the opposite side of said lens holder sleeve to that on which said urging member lies, said lens drive member being made of piezoelectric material in a ring shape and being in contact with said lens holder sleeve so that when a voltage corresponding to the required amount of movement of said lens is applied to said lens drive member, said lens holder sleeve is moved against the biasing force of said urging member;
   said lens driving member comprising an abutment portion in contact with said lens holder sleeve and a plurality of support arms helically extending from said abutment portion and made of piezeoelectric material, one end of each of said support arms being in abutting engagement with or fixedly secured to said body tube, whereby when a voltage corresponding to a required amount of movement of said lens is applied to said drive member, said lens is driven to move axially by the piezoelectric action of said support arm.

2. A lens moving apparatus comprising:
(a) a lens holder sleeve containing a movable lens;
(b) a body tube containing said lens holder sleeve;
(c) a member urging said lens holder sleeve to an initial position; and
(d) a lens drive member arranged on the opposite side of said lens holder sleeve to that on which said urging member lies, said lens drive member being made of piezoelectric material in a ring shape and being in contact with said lens holder sleeve so that when a voltage corresponding to the required amount of movement of said lens is applied to said lens drive member, said lens holder sleeve is moved against the biasing force of said urging member;
said lens drive member being constructed with a plurality of pairs of piezoelectric elements mating with each other in such a way that their voltage response distortion characteristics are opposite to each other in each pair and in axially superimposed relation from pair to pair, and
further comprising conducting means for maintaining electrical connection between each successive pair of said plurality of piezoelectric elements.

3. A lens moving apparatus comprising:
(a) a lens holder sleeve containing a movable lens;
(b) a body tube containing said lens holder sleeve; and
(c) ring-shaped first and second lens moving members made of piezoelectric material and arranged on either side of said lens holder sleeve, said first and said second lens moving members having bent shapes extending in directions opposite to each other, with the outer periphery of the ring shape abutting on said lens holder sleeve, whereby a voltage of polarity corresponding to the moving direction is applied to each of said lens moving members through electrical connection terminals on said members to produce an electro-distortion effect by which said movable lens is moved.

4. A lens moving apparatus according to claim 3, further comprising:
contact means provided between said first and second lens moving members and said lens holder sleeve.

5. A lens moving apparatus according to claim 1 or 3, further comprising:
bearing means arranged between said lens holder sleeve and said body tube.

6. A lens moving apparatus according to claim 1 or 2, further comprising:
point contact means provided between said drive member and said lens holder sleeve.

* * * * *